United States Patent
Jianpu et al.

(10) Patent No.: US 7,443,093 B2
(45) Date of Patent: Oct. 28, 2008

(54) LIGHT-EMITTING DISPLAY DEVICE PROVIDED WITH LIGHT-EMITTING PORTIONS HAVING VARYING AREAS

(75) Inventors: Wang Jianpu, Yongin-si (KR); Jin-Koo Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 605 days.

(21) Appl. No.: 11/093,580

(22) Filed: Mar. 30, 2005

(65) Prior Publication Data

US 2005/0218792 A1  Oct. 6, 2005

(30) Foreign Application Priority Data

Mar. 31, 2004  (KR) .................. 10-2004-0022169

(51) Int. Cl.
*H01L 51/50* (2006.01)
*H05B 33/00* (2006.01)

(52) U.S. Cl. .................. 313/500; 313/505; 313/503

(58) Field of Classification Search ......... 313/495–512; 315/169.3, 500–512

See application file for complete search history.

(56) References Cited

U.S. PATENT DOCUMENTS

| | | | | |
|---|---|---|---|---|
| 6,366,025 | B1 * | 4/2002 | Yamada | 315/169.3 |
| 6,867,549 | B2 * | 3/2005 | Cok et al. | 315/169.3 |
| 7,202,841 | B2 * | 4/2007 | Matsumoto | 345/76 |
| 7,279,834 | B2 * | 10/2007 | Kanno et al. | 313/504 |
| 2002/0186214 | A1 * | 12/2002 | Siwinski | 345/212 |
| 2004/0051448 | A1 * | 3/2004 | Matsumoto | 313/506 |
| 2004/0201558 | A1 * | 10/2004 | Arnold et al. | 345/83 |
| 2006/0170712 | A1 * | 8/2006 | Miller et al. | 345/695 |

* cited by examiner

*Primary Examiner*—Mariceli Santiago
(74) *Attorney, Agent, or Firm*—F. Chau & Associates, LLC

(57) ABSTRACT

A display device for increasing a lifetime includes a base substrate having a plurality of pixel regions, a plurality of first electrodes formed on the pixel regions, a light emitting layer including first, second and third light emitting portions to generate first, second and third lights, a second electrode that is electrically coupled to the light emitting layer. At least two of the first, second and third light emitting portions have different areas from each other. The areas of the light emitting portions are determined by reference lifetimes. Therefore, the lifetime for the display device is increased.

24 Claims, 9 Drawing Sheets

LIGHT-EMITTING DISPLAY DEVICE PROVIDED WITH LIGHT-EMITTING PORTIONS HAVING VARYING AREAS

CROSS-REFERENCE TO RELATED APPLICATIONS

This application relies for priority upon Korean Patent Application No.2004-22169 filed on Mar. 31, 2004, the contents of which are herein incorporated by reference in its entirety.

BACKGROUND OF THE INVENTION

1. Field of the Invention

The present invention relates to a display device and method of manufacturing the display device. More particularly, the present invention relates to a display device capable of increasing lifetime and a method of manufacturing the display device.

2. Description of the Related Art

Generally, a display device converts data processed by an information-processing device into an image.

An organic light emitting device (OLED) displays the image using an organic light emitting layer interposed between a pair of electrodes corresponding to each other. A conventional OLED includes a red light emitting layer that generates a red light, a green light emitting layer that generates a green light, and a blue light emitting layer that generates a blue light.

The conventional OLED has various characteristics, for example, such as high color reproducibility, low driving voltage, low power consumption, thin thickness, etc. However, the lifetime for each of the red light emitting layer, green light emitting layer and the blue light emitting layer of the conventional OLED is not uniform so that the lifetime for the OLED is reduced.

SUMMARY OF THE INVENTION

Accordingly, the present invention is provided to substantially obviate one or more problems due to limitations and disadvantages of the related art.

The present invention provides a display device having increased lifetime.

The present invention also provides a method of manufacturing a display device.

According to an aspect of the present invention, a display device includes a base substrate having a plurality of pixel regions, a plurality of first electrodes formed on the pixel regions, respectively, a light emitting layer on the first electrodes and a second electrode. The light emitting layer includes first, second and third light emitting portions to generate first, second and third lights, respectively. At least two of the first, second and third light emitting portions have different areas from each other. The areas of the light emitting portions are determined by reference lifetimes. The second electrode is electrically coupled to the light emitting portions.

According to another aspect of the present invention, a display device includes a base substrate having first, second and third pixel regions, a plurality of first electrodes formed on the first, second and third pixel regions, respectively, a light emitting layer on the first electrodes and a second electrode. The light emitting layer includes a first light emitting portion on the first pixel region, a second light emitting portion on the second pixel region, and a third light emitting portion on the third pixel region to generate first, second and third lights, respectively. At least two of the first, second and third pixel regions have different areas from each other. A ratio of each of the areas of the first, second and third pixel regions to each of areas of the first, second and third light emitting portions is uniform. The areas of the pixel regions are determined by reference lifetimes of the light emitting portions.

According to still another aspect of the present invention, a display device includes a base substrate, a plurality of first electrodes formed on the first, second and third pixel regions, respectively, a light emitting layer on the first electrodes, and a second electrode. The light emitting layer includes first, second and third light emitting portions having fourth, fifth and sixth areas, respectively, and the second electrode is electrically coupled to the light emitting portions. The base substrate includes a first pixel region that has a first area, a second pixel region that has a second area and a third pixel region that has a third pixel region. At least two of the first, second and third areas are different from each other. At least two of the fourth, fifth and sixth areas are different from each other.

According to still another aspect of the present invention, a display device includes a base substrate having a plurality of pixel regions, a plurality of first electrodes formed on the pixel regions, respectively, a light emitting layer and a second electrode. The light emitting layer includes first, second, third and fourth light emitting portions to generate first, second, third and white lights. At least two of the first, second, third and fourth light emitting portions have different areas from each other. The second electrode is electrically coupled to the light emitting portions.

According to an aspect of the present invention, a method of manufacturing a display device is provided as follows. First electrodes are in a plurality of pixel regions on a base substrate, respectively. A red light emitting portion, a green light emitting portion and a blue light emitting portion are formed on the first electrodes, respectively. At least two of the red, green and blue light emitting portions have different areas from each other. The areas of the red, green and blue light emitting portions are determined by reference lifetimes of the light emitting portions. A second electrode that is electrically coupled to the red, green and blue light emitting portions is formed on the red, green and blue light emitting portions, respectively.

According to another aspect of the present invention, a method of manufacturing a display device is provided as follows. A white light is formed from a light emitting layer including red, green and blue light emitting portions. Lifetimes of the red, green and blue light emitting portions are calculated. Areas of the red, green and blue light emitting portions are adjusted with reference to reference lifetimes of the red, green and blue light emitting portions.

The areas are determined by reference lifetimes of the light emitting portions. Each of the reference lifetimes is a lifetime for each of the light emitting portions of unit areas through which unit current has passed. The lifetime is a time period when a luminance of each of the red, green and blue light emitting portions decreases to a half of an initial luminance of each of the light emitting portions. The reference lifetimes are physical properties of materials in the light emitting portions.

BRIEF DESCRIPTION OF THE DRAWINGS

The above and other features and advantage points of the present invention will become more apparent by describing in detailed exemplary embodiments thereof with reference to the accompanying drawings.

DESCRIPTION OF EMBODIMENTS

Hereinafter, the preferred embodiment of the present invention will be described in detail with reference to the accompanied drawings.

Embodiment 1

Figure 1:
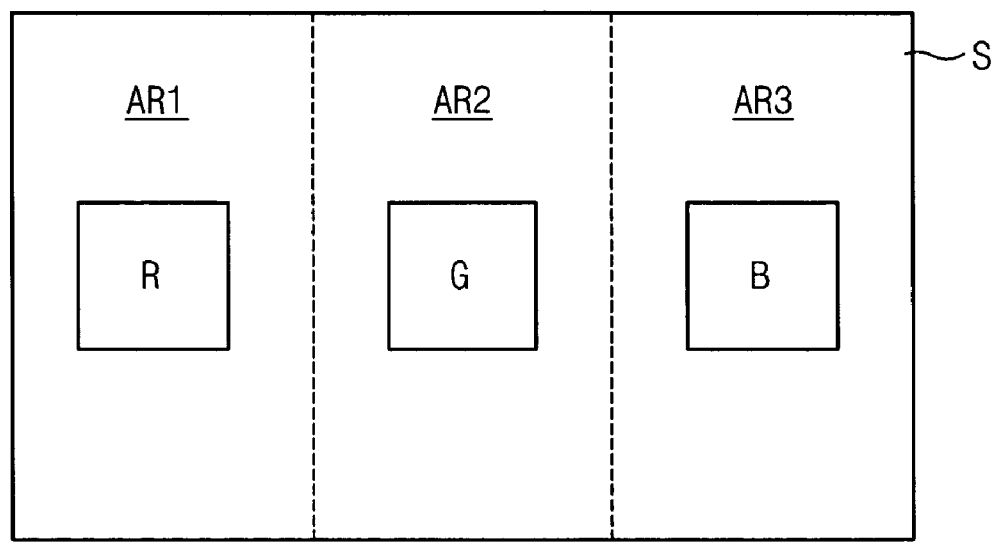
FIG. 1 is a plan view illustrating a display device according to a first embodiment of the present invention.

FIG. 1 is a plan view illustrating a display device according to a first embodiment of the present invention.

Referring to FIG. 1, a plurality of regions is formed on a base substrate S. Each of the regions includes a first sub-pixel region AR1, a second sub-pixel region AR2 and a third sub-pixel region AR3. For example, the first, second and third sub-pixel regions AR1, AR2 and AR3 have a substantially equal size to one another.

A red light emitting portion R for generating a red light is on the first sub-pixel region AR1, a green light emitting portion G for generating a green light is on the second sub-pixel region AR2, and a blue light emitting layer B for generating a blue light is on the third sub-pixel region AR3.

In this embodiment, the red, green and blue light emitting portions R, G and B have a substantially equal size to one another.

Each of the red, green and blue light emitting portions R, G and B is deteriorated so that a luminance of each of the red, green and blue light emitting portions R, G and B decreases as an operation time of each of the red, green and blue light emitting portions R, G and B increases. In this embodiment, a lifetime for each of the red, green and blue light emitting portions R, G and B corresponds to the operation time when the luminance for each of the red, green and blue lights generated from the red, green and blue light emitting portions R, G and B becomes a half of an initial luminance thereof. A reference lifetime is a lifetime for each of the red, green and blue light emitting portions R, G and B of unit areas through which unit current has passed. In this embodiment, the areas of the red, green and blue light emitting portions R, G and B and the currents that flow through the red, green and blue light emitting portions R, G and B are substantially equal to one another so that the reference lifetimes of the red, green and blue light emitting portions R, G and B are substantially equal to the lifetimes of the red, green and blue light emitting portions R, G and B.

The lifetime and the reference lifetime for each of the red, green and blue light emitting portions R, G and B vary based on the luminance such as the initial luminance. For example, when the initial luminance of the light generated from the red, green and blue light emitting portions R, G and B increases, the lifetimes of the red, green and blue light emitting portions R, G and B decrease. Alternatively, when the initial luminance of the light generated from the red, green and blue light emitting portions R, G and B decreases, the lifetimes of the red, green and blue light emitting portions R, G and B increase. The initial luminance of the light generated from each of the red, green and blue light emitting portions R, G and B increases in proportion to a current density applied to each of the red, green and blue light emitting portions R, G and B, respectively. The current density is an amount of a current that flows through each of the red, green and blue light emitting portions R, G and B of the unit area. For example, when the current density applied to the red, green and blue light emitting portions R, G and B increases, the lifetimes of the red, green and blue light emitting portions R, G and B decrease.

In addition, when the current density applied to the red, green and blue light emitting portions R, G and B decreases, the lifetimes of the red, green and blue light emitting portions R, G and B increase.

Table 1 represents the lifetimes and optical properties of the red, green and blue light emitting portions R, G and B of the first embodiment of the present invention. In Table 1, the lifetimes of the red, green and blue light emitting portions are substantially equal to one another.

TABLE 1

|  | Color coordinator | Lifetimes | initial luminance |
| --- | --- | --- | --- |
| Red light emitting portion | (0.64, 0.35) | 10,000 hour | 800 cd/m$^2$ |
| Green light emitting portion | (0.27, 0.63) | 10,000 hour | 600 cd/m$^2$ |
| Blue light emitting portion | (0.14, 0.14) | 10,000 hour | 300 cd/m$^2$ |

As shown in Table 1, the lifetime for the red light emitting portion R is 10,000 hours when the initial luminance of the red light emitting portion R is 800 cd/m$^2$. The lifetime for the green light emitting portion G is 10,000 hours, when the initial luminance of the green light emitting portion G is 600 cd/m$^2$. The lifetime for the blue light emitting portion B is 10,000 hours, when the initial luminance of the blue light emitting portion B is 300 cd/m$^2$.

When the initial luminance of the red light emitting portion R is lower than 800 cd/m$^2$, the lifetime for the red light emitting portion R is greatly increased. On the contrary, when the initial luminance of the red light emitting portion R is greater than 800 cd/m$^2$, the lifetime for the red light emitting portion R is greatly reduced.

When the initial luminance of the green light emitting portion G is lower than 600 cd/m$^2$, the lifetime for the green light emitting portion G is greatly increased. On the contrary, when the initial luminance of the green light emitting portion G is more than 600 cd/m$^2$, the lifetime for the green light emitting portion G is greatly reduced.

When the initial luminance of the blue light emitting portion B is lower than 300 cd/m², the lifetime for the red light emitting portion B is greatly increased. On the contrary, when the initial luminance of the blue light emitting portion B is more than 300 cd/m², the lifetime for the green light emitting portion B is greatly reduced.

In this embodiment, a first aperture ratio of an area of the first sub-pixel region AR1 to an area of the red light emitting region R is 40%. A second aperture ratio of an area of the second sub-pixel region AR2 to an area of the green light emitting region G is 40%. A third aperture ratio of an area of the third sub-pixel region AR3 to an area of the blue light emitting region G is 40%.

The image is displayed using the red, green and blue lights. Alternatively, the red, green and blue lights may be mixed to form a white light. A luminance of the red light, a luminance of the green light, and a luminance of the blue light are different from one another. That is, the red, green and blue lights are in a predetermine ratio for displaying the image. When the red, green and blue lights shown in FIG. 1 are mixed in the ratio of 30%, 50% and 20%, the white light is formed.

For example, when an entire luminance of the mixture of the red, green, and blue lights is 300 cd/m², the luminance of the mixed light formed from the mixture of the red, green and blue lights is 100 cd/m², and the red, green and blue lights have a luminance of 90 cd/m², a luminance of 150 cd/m², and a luminance of 60 cd/m², respectively. Thus, the red light having the luminance of 90 cd/m², the green light having the luminance of 150 cd/m², and the blue light having the luminance of 60 cd/m² form the mixed light having the luminance of 100 cd/m².

As a result, the red, green and blue lights are mixed in the ratio of 90 cd/m², 150 cd/m² and 60 cd/m² to form the mixed light having the luminance of 100 cd/m².

Each of the initial luminance of the red, green and blue light emitting portions R, G and B for displaying the image may be expressed by Equation 1.

$$R_1 = R_2 \times \frac{1}{OR1} \times \frac{1}{LR1} \qquad \text{Equation 1}$$

In the above Equation 1, $R_1$, $R_2$, OR1 and LR1 represent the initial luminance of the red light emitting portion R, the luminance of the red light emitting portion R, the aperture ratio of the red light emitting portion R and a loss of the red light generated from the red light emitting portion R, respectively.

For example, when $R_2$, OR1 and LR2 are 90 cd/m², 40% and 50%, respectively, $R_1$ is $$90 \text{ cd/m}^2 \times \frac{1}{0.4} \times \frac{1}{0.5}$$

so that $R_1$ is 451 cd/m².

$$G_1 = G_2 \times \frac{1}{OR2} \times \frac{1}{LR2} \qquad \text{Equation 2}$$

In the above Equation 2, $G_2$, $G_3$, OR2 and LR2 represent the initial luminance of the green light emitting portion G, the luminance of the green light emitting portion G, the aperture ratio of the green light emitting portion G and the loss of the green light generated from the green light emitting portion G, respectively.

For example, when $G_2$, OR1 and LR2 are 150 cd/m², 40% and 50%, respectively, $G_1$ is $$150 \text{ cd/m}^2 \times \frac{1}{0.4} \times \frac{1}{0.5}$$

so that $G_1$ is 737 cd/m².

$$B_1 = B_2 \times \frac{1}{OR3} \times \frac{1}{LR3} \qquad \text{Equation 3}$$

In the above Equation 3, $B_1$, $B_2$, OR3 and LR3 represent the object luminance of the blue light emitting portion B, the luminance of the blue light emitting portion B, the aperture ratio of the blue light emitting portion B, and a loss of the red light generated from the red light emitting portion B, respectively.

For example, when $B_2$, OR3 and LR3 are 60 cd/m², 40% and 50%, respectively, $G_1$ is $$60 \text{ cd/m}^2 \times \frac{1}{0.4} \times \frac{1}{0.5}$$

so that $G_1$ is 312 cd/m².

Table 2 represents the object luminance for each of the red, green and blue lights and the lifetime for each of the red, green and blue light emitting portions of the present invention. In Table 2, the currents that flow through the red, green and blue light emitting portions are substantially equal to one another, and the areas of the red, green and blue light emitting portions are substantially equal to one another so that the lifetimes of the red, green and blue light emitting portions are substantially equal to the reference lifetimes of the red, green and blue light emitting portions, respectively. That is, the luminance-reference lifetime data of the red, green and blue light emitting portions is calculated.

TABLE 2

|  | R | G | B |
| --- | --- | --- | --- |
| Luminance of the mixed light |  | 100 cd/m² |  |
| Loss |  | 50% |  |
| Area ratio |  | 33.3% |  |
| Aperture ratio | 40% | 40% | 40% |
| Initial luminance | 451 cd/m² | 737 cd/m² | 312 cd/m² |
| Lifetime | 23,592 hour | 7,352 hour | 9,429 hour |

As shown in Table 2, when the aperture ratios of the red, green and blue light emitting portions are substantially equal to one another, the lifetimes of the red, green and blue light emitting portions are 23,952 hour, 9,429 hour, and 7,352. Thus, the green light emitting portion G determines the lifetime for the display device so that the lifetime for the display device is 7,352. In this embodiment, the areas of the red, green and blue light emitting portions are substantially equal to one another, and the currents that flows through the red, green and blue light emitting portions are substantially equal to one another so that the lifetimes of the red, green and blue light emitting portions are substantially equal to the reference lifetimes of the red, green and blue light emitting portions, respectively.

According to this exemplary embodiment, luminance-reference lifetime data of the red, green and blue light emitting portions are estimated.

Embodiment 2

Figure 2:
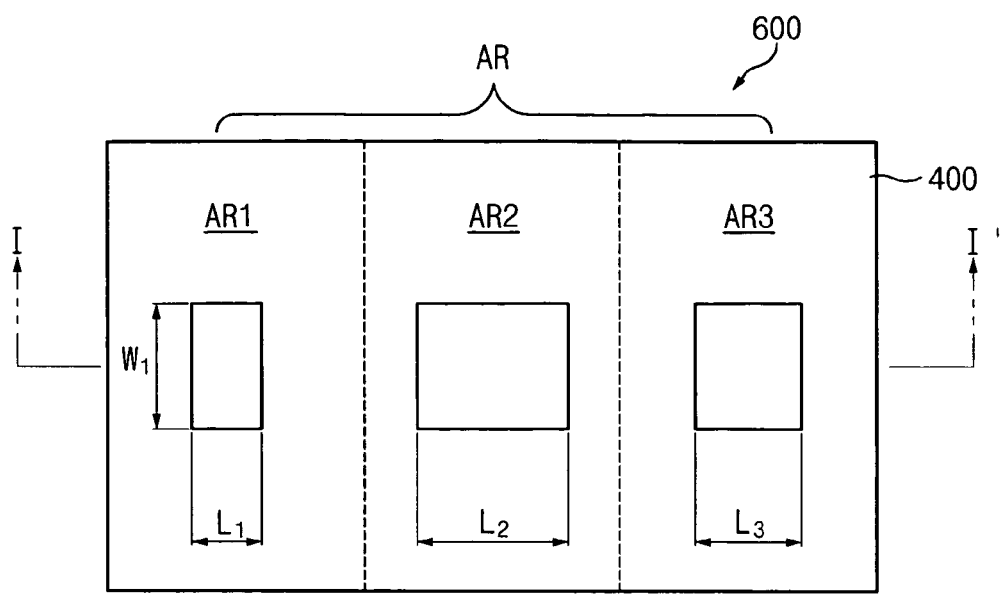
FIG. 2 is a plan view illustrating a display device according to a second embodiment of the present invention.
Figure 3:
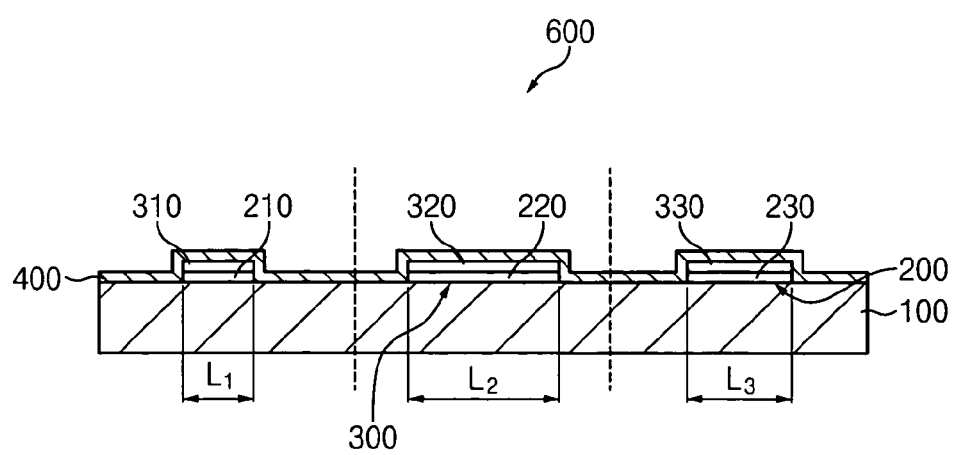
FIG. 3 is a cross-sectional view taken along a line I-I' in FIG. 2.

FIG. 2 is a plan view illustrating a display device according to a second embodiment of the present invention. FIG. 3 is a cross-sectional view taken along a line I-I' in FIG. 2.

Referring to FIGS. 2 and 3, a display device 600 includes a base substrate 100, a plurality of first electrodes 200, a light emitting layer 300, and a second electrode 400.

The base substrate 110 may include a transparent substrate, a light absorbing substrate or a flexible substrate. In this embodiment, the base substrate 100 includes a transparent glass substrate having a rectangular plate shape.

The base substrate 110 includes a plurality of regions for displaying an image.

The regions formed on the base substrate 110 have a first sub-pixel region AR1, a second sub-pixel region AR2 and a third sub-pixel region AR3 in a matrix configuration.

The number of the regions is determined by a resolution of the display device 600. When the resolution of the display device is about 1024×768, the number of the regions in the display device 700 is about 1024×768×3 for full-color image.

The first electrodes are formed on the regions of the base substrate 100. In detail, the first electrodes are formed on the first, second and third sub-pixel regions AR1, AR2 and AR3, respectively.

In this embodiment of the present invention, each of the first electrodes may include a transparent conductive material, for example, such as indium tin oxide (ITO), indium zinc oxide (IZO), amorphous indium tin oxide (a-ITO), etc. Alternatively, the first substrates may include a metal blocking the light.

Areas of the first electrodes 200 formed on the base substrate 100 may be substantially equal to each other. Alternatively, areas of the first electrodes 200 may be different from each other.

The second electrode 400 is over the first electrodes 200. The second electrode 400 includes a transparent conductive material, for example, such as ITO, IZO or a-ITO, etc. Alternatively, the second electrode 400 may include a metal blocking the light.

In this embodiment, when the first electrodes 200 are transparent conductive electrodes, the second electrode 400 may be a metal electrode. Alternatively, when the first electrodes 200 are metal electrodes, the second electrode 400 may be the transparent conductive electrode.

The light emitting layer 300 is interposed between the first and second electrodes 200 and 400. Thus, the light emitting layer 300 is electrically connected to the first and second electrodes 200 and 400.

The light emitting layer 300 includes a red light emitting portion 310, a green light emitting portion 320, and a blue light emitting portion 330. The red, green and blue light emitting portions 310, 320 and 330 are alternately disposed on the first electrodes 200, respectively. Alternatively, the red, green and blue light emitting portions 310, 320 and 330 may have various arrangements.

The light emitting layer 300 having a thin film shape includes various organic light emitting materials. Holes that are provided from the first electrode 200 are combined with electrons that are provided from the second electrode 400 in the light emitting layer 300 to generate excitons. A light is generated in the light emitting layer 300 by the excitons.

The light-emitting layer 300 generates a color light, for example, such as a red light, a green light and a blue light in accordance with various organic light emitting materials. For example, the red light emitting portion 310 generates the red light. The green light emitting portion 320 generates the green light. The blue light emitting portion 330 generates the blue light. The red, green and blue lights are mixed to display an image.

In this embodiment, a luminance of the red light, a luminance of the green light, and a luminance of the blue light are different from one another. For example, the red, green and blue lights are mixed in a predetermine ratio to display the image. The red, green and blue lights may be independently used to display the image. Alternatively, the red, green and blue lights may be mixed in the ratio of 30%, 50% and 20% to form a white light.

For example, when an entire luminance of the mixture of the red, green and blue lights is 300 cd/m$^2$, the luminance of the mixed light formed from the mixture of the red, green and blue lights is 100 cd/m$^2$, and the red, green and blue lights have a luminance of 90 cd/m$^2$, a luminance of 150 cd/m$^2$, and a luminance of 60 cd/m$^2$, respectively. Thus, the red light having the luminance of 90 cd/m$^2$, the green light having the luminance of 150 cd/m$^2$, and the blue light having the luminance of 60 cd/m$^2$ form the mixed light having the luminance of 100 cd/m$^2$.

The red, green and blue light emitting portions 310, 320 and 330 are manufactured by various organic light emitting material so that reference lifetimes and lifetimes of the red, green and blue emitting layers 310, 320 and 330 are different from one another. Thus, a lifetime for the display device having the light emitting layer 300 is determined by a light emitting layer that has shortest lifetime among the red, green and blue light emitting portions 310, 320 and 330.

Referring again to FIGS. 2 and 3, red light emitting portion 310 has a first area, the green light emitting portion 320 has a second area, and the blue light emitting portion 330 has a third area, and the first, second and third areas are determined so as to increase a lifetime for the display device. The first, second and third areas are different from one another.

In this embodiment of the present invention, the first area of the red light emitting portion 310 is about $W_1 \times L_1$, the second area of the green light emitting portion 320 is about $W_1 \times L_2$, and the third area of the third blue emitting layer 330 is about $W_1 \times L_3$. $L_1$, $L_2$ and $L_3$ are different from one another.

Referring again to Table 2, when the aperture ratios of the red light emitting portion R, the green light emitting portion G and the blue light emitting portion B are substantially equal to one another, the lifetimes of the red, blue and green light emitting portions R, B and G are successively reduced by the named order. For example, the lifetime for the red light emitting portion R is 23,592 hour, the lifetime for the blue light emitting portion B is 9,429, and the lifetime for the green light emitting portion G is 7,352.

In this embodiment of the present invention, the first area of the red light emitting portion 310 having a longest lifetime is reduced so that a current density of the red light emitting portion 310 is increased. When the current density of the red light emitting portion 310 is increased, a luminance of a light generated from the red light emitting portion 310 of the unit area is increased so that the lifetime for the red light emitting portion 310 is decreased. The second area of the green light emitting portion 320 having a shortest lifetime is increased so that a current density of the green light emitting portion 320 is decreased. When the current density of the green light emitting portion 320 is decreased, a luminance of a light generated from the green light emitting portion 320 of the unit area is decreased so that the lifetime for the green light emitting portion 320 is increased.

Table 3 represents the initial luminances of the red, green and blue lights and the lifetimes of the red, green and blue light emitting portions 310, 320 and 330 of the present invention.

TABLE 3

|  | R | G | B |
| --- | --- | --- | --- |
| Luminance of the mixed light |  | 100 cd/m$^2$ |  |
| Loss |  | 50% |  |
| Area ratio |  | 33.3% |  |
| Aperture ratio | 23% | 50% | 42% |
| Initial luminance | 785 cd/m$^2$ | 589 cd/m$^2$ | 297 cd/m$^2$ |
| Lifetime | 10,287 hour | 10,274 hour | 10,145 hour |

Referring to Tables 2 and 3, the aperture ratio of the red light emitting portion 310 is reduced from 40% to 23% to increase a current density of the red light emitting portion 310. Thus, the initial luminance of the red light emitting portion 310 is increased from 451 cd/m$^2$ to 785 cd/m$^2$ so that the lifetime for the red light emitting portion 310 is reduced from 23,592 hours to 10,287 hours.

The aperture ratio of the green light emitting portion 320 is increased from 40% to 50% to reduce a current density of the green light emitting portion 310. Thus, the initial luminance of the green light emitting portion 320 is reduced from 731 cd/m$^2$ to 589 cd/m$^2$ so that the lifetime for the green light emitting portion 320 is increased from 7,352 hours to 10,274 hours.

The aperture ratio of the blue light emitting portion 330 is increased from 40% to 42% to reduce a current density of the blue light emitting portion 330. Thus, the initial luminance of the blue light emitting portion 330 is reduced from 312 cd/m$^2$ to 297 cd/m$^2$ so that the lifetime for the blue light emitting portion 330 is increased from 9,429 hours to 10,145 hours.

As it is described above, the first area of the red light emitting portion 310 having the longest lifetime among the red, green and blue light emitting portions 310, 320 and 330 is reduced so that the current density of the red light emitting portion 310 is increased. On the contrary, the second area of the green light emitting portion 320 having a shortest lifetime among the red, green and blue light emitting portions 310, 320 and 330 is increased so that the current density of the green light emitting portion 320 is decreased, thereby increasing the lifetime for the green light emitting portion 320. Therefore, the red, green and blue light emitting portions 310, 320 and 330 are substantially same as one another, although reference lifetimes of the red, green and blue light emitting portions 310, 320 and 330 are different from one another, thereby increasing the lifetime for the display device.

Embodiment 3

Figure 4:
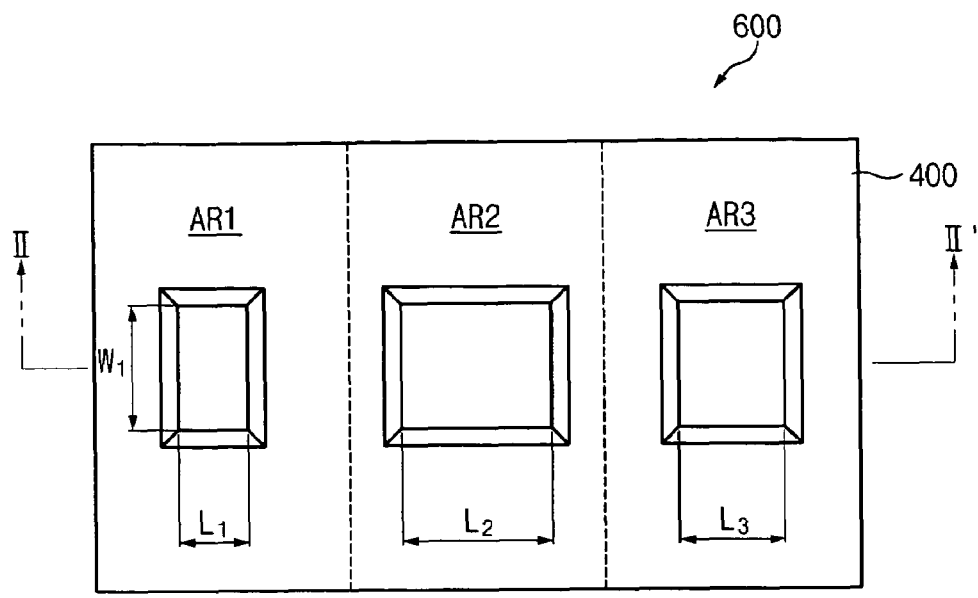
FIG. 4 is a plan view illustrating a display device in accordance with a third embodiment of the present invention.
Figure 5:
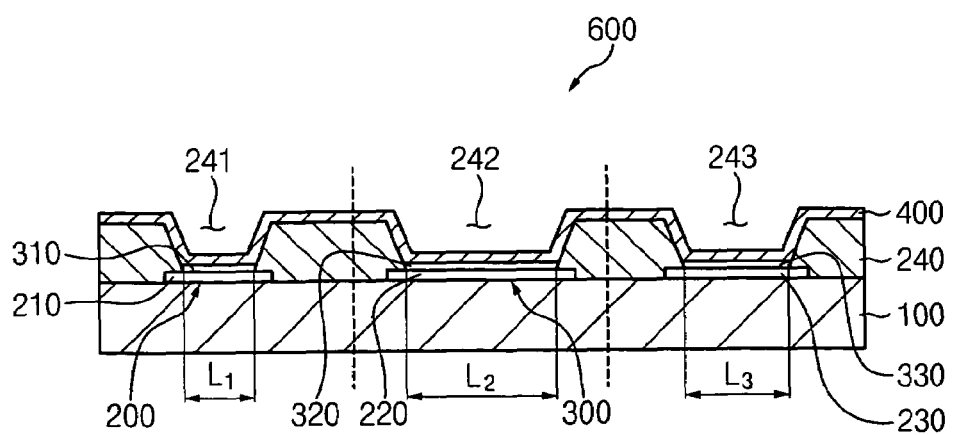
FIG. 5 is a cross-sectional view taken along a line II-II' in FIG. 4.

FIG. 4 is a plan view illustrating a display device in accordance with a third embodiment of the present invention. FIG. 5 is a cross-sectional view taken along a line II-II' in FIG. 4. The display device of the present embodiment is same as in Embodiment 2 except for a bank. Thus, the same reference numerals will be used to refer to the same or like parts as those described in Embodiment 2 and any further explanation concerning the above elements will be omitted.

Referring to FIGS. 4 and 5, a bank 240 is on a base substrate 100 so as to insulate a plurality of first electrodes 200. The first electrodes 200 are grouped into three groups. A first group of the first electrodes 200 includes first sub-electrodes 210. A second group of the first electrodes 200 includes second sub-electrodes 220. A third group of the first electrodes 300 includes third sub-electrodes 230. The first, second and third groups are on the base substrate 100. The first, second and third groups are arranged in a matrix shape.

An organic film having an organic material such as a photosensitive material or an inorganic film having an inorganic material is formed on the base substrate 100, and patterned to form the bank 240.

The first, second and third electrodes 210, 220 and 230 are on the base substrate 100. The first, second and third electrodes 210, 220 and 230 are arranged in a matrix shape so that the bank 240 between the first, second and third sub-electrodes 210, 220 and 230 has a lattice shape. The bank 240 having the lattice shape covers a peripheral portion of the first, second and third electrodes 210, 220 and 230.

The red light emitting portion 310 is formed on each of the first sub-electrodes 210, the green light emitting portion 320 is formed on each of the second sub-electrodes 220, and the blue light emitting portion 330 is formed on each of the third sub-electrodes 230. In order to increase the lifetime for the display device, a first area of the red light emitting portion 310, a second area of the green light emitting portion 320, and a third area of the blue light emitting portion 330 are different from one another.

The first, second and third areas are determined by a width of the bank 240. When the width of the bank 240 increases, each of the first to the third areas is decreased. When the width of the bank 240 decreases, each of the first to the third areas is increased.

For example, the first area formed by the bank 240 of the red light emitting portion 310 is about $W_1 \times L_1$, the second area formed by the bank 240 of the green light emitting portion 320 is about $W_1 \times L_2$, and the third area formed by the bank 240 of the third blue emitting layer 330 is about $W_1 \times L_3$. Preferably, $L_1$, $L_2$ and $L_3$ are different from each other.

Table 4 represents the initial luminances of the red, green and blue lights and the lifetimes of the red, green and blue light emitting portions 310, 320 and 330 of the embodiment of the present invention.

TABLE 4

|  | R | G | B |
| --- | --- | --- | --- |
| Luminance of the mixed light |  | 100 cd/m$^2$ |  |
| Loss |  | 50% |  |
| Area ratio |  | 33.3% |  |
| Aperture ratio | 29.0% | 46.0% | 42.0% |
| Initial luminance | 752 cd/m$^2$ | 567 cd/m$^2$ | 284 cd/m$^2$ |
| Lifetime | 10,965 hour | 10,897 hour | 10,878 hour |

Referring to Tables 2 and 4, the aperture ratio of the red light emitting portion 310 is reduced from 40% to 29% to increase a current density of the red light emitting portion 310. Thus, the initial luminance of the red light emitting portion 310 is increased from 451 cd/m$^2$ to 752 cd/m$^2$ so that the lifetime for the red light emitting portion 310 is reduced from 23,592 hours to 10,965 hours.

The aperture ratio of the green light emitting portion 320 is increased from 40% to 46% to reduce a current density of the green light emitting portion 310. Thus, the initial luminance of the green light emitting portion 320 is reduced from 731 cd/m² to 567 cd/m² so that the lifetime for the green light emitting portion 320 is increased from 7,352 hours to 10,897 hours.

The aperture ratio of the blue light emitting portion 330 is increased from 40% to 42% to reduce a current density of the blue light emitting portion 330. Thus, the initial luminance of the blue light emitting portion 330 is reduced from 312 cd/m² to 284 cd/m² so that the lifetime for the blue light emitting portion 330 is increased from 9,429 hours to 10,878 hours.

As it is described above, the first area of the red light emitting portion 310 having the longest lifetime among the red, green and blue light emitting portions 310, 320 and 330 is reduced so that the current density of the red light emitting portion 310 is increased. On the contrary, the second area of the green light emitting portion 320 having a shortest lifetime among the red, green and blue light emitting portions 310, 320 and 330 is increased so that the current density of the green light emitting portion 320 is decreased, thereby increasing the lifetime for the green light emitting portion 320.

Embodiment 4

Figure 6:
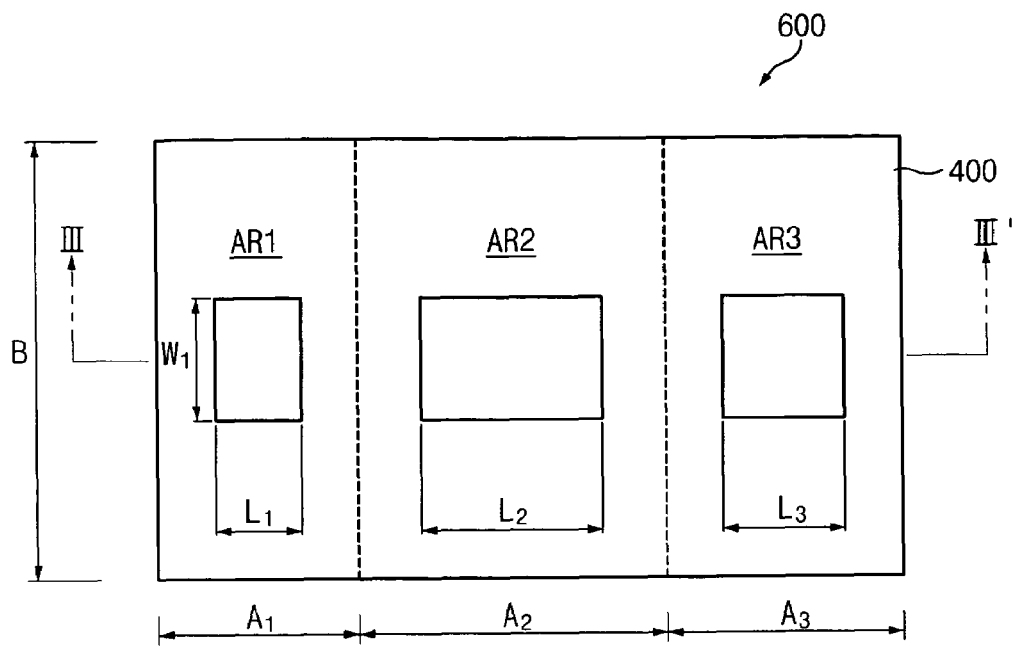
FIG. 6 is a plan view illustrating a display device in accordance with a fourth embodiment of the present invention.
Figure 7:
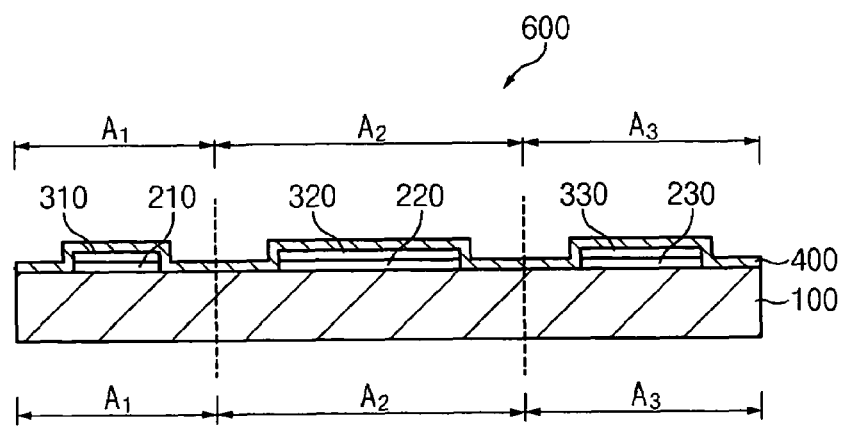
FIG. 7 is a cross-sectional view taken along a line III-III' in FIG. 6.

FIG. 6 is a plan view illustrating a display device in accordance with a fourth embodiment of the present invention. FIG. 7 is a cross-sectional view taken along a line III-III' in FIG. 6. The display device of the present embodiment is same as in Embodiment 2 except for first, second and third sub-pixel regions. Thus, the same reference numerals will be used to refer to the same or like parts as those described in Embodiment 2 and any further explanation concerning the above elements will be omitted.

Referring to FIGS. 6 and 7, in order to increase the lifetime for the display device, a first area of a first sub-pixel region AR1, a second area of a second sub-pixel region AR2, and a third area of a third sub-pixel region AR3 330 are different from one another. The first sub-pixel region AR1 has a first length $A_1$ and a width B. The second sub-pixel region AR2 has a second length $A_2$ and the width B. The third sub-pixel region AR3 has a third length $A_3$ and the width B. Preferably, the first, second and third lengths $A_1$, $A_2$ and $A_3$ are different from one another. For example, the second length $A_2$ is larger than the third length $A_3$, and the third length $A_3$ is larger than the first length $A_1$.

A red light emitting portion 310, a green light emitting portion 320 and a blue light emitting portion 330 are formed on the first, second and third sub-pixel regions AR1, AR2 and AR3, respectively.

Table 5 represents the initial luminances of the red, green and blue lights and the lifetimes of the red, green and blue light emitting portions 310, 320 and 330 of the embodiment of the present invention.

TABLE 5

|  | R | G | B |
|---|---|---|---|
| Luminance of the mixed light | | 100 cd/m² | |
| Loss | | 50% | |
| Relative area ratio | 0.60 | 1.30 | 1.10 |
| Aperture ratio | 40% | 40% | 40% |
| Initial luminance | 752 cd/m² | 567 cd/m² | 284 cd/m² |
| Lifetime | 10,965 hour | 10,897 hour | 10,878 hour |

Referring to Tables 2 and 5, the relative area ratio of the red light emitting portion 310 is reduced from 1 to 0.6 to increase a current density of the red light emitting portion 310. The relative area ratio is a ratio of an area of each of the first, second and third sub-pixel regions AR1, AR2 and AR3 to one-third of the total area of the first, second and third sub-pixel regions AR1, AR2 and AR3. Thus, the initial luminance of the red light emitting portion 310 is increased from 451 cd/m² to 752 cd/m² so that the lifetime for the red light emitting portion 310 is reduced from 23,592 hours to 10,965 hours.

The relative area ratio of the green light emitting portion 320 is increased from 1 to 1.30to reduce a current density of the green light emitting portion 310. Thus, the initial luminance of the green light emitting portion 320 is reduced from 731 cd/m² to 567 cd/m² so that the lifetime for the green light emitting portion 320 is increased from 7,352 hours to 10,897 hours.

The relative area ratio of the blue light emitting portion 330 is increased from 1 to 1.10 to reduce a current density of the blue light emitting portion 330. Thus, the initial luminance of the blue light emitting portion 330 is reduced from 312 cd/m² to 284 cd/m² so that the lifetime for the blue light emitting portion 330 is increased from 9,429 hours to 10,878 hours.

As it is described above, the red light emitting portion 310 having a longest lifetime among the red, green and blue light emitting portions 310, 320 and 330 is reduced so that the current density of the red light emitting portion 310 is increased. On the contrary, the green light emitting portion 320 having a shortest lifetime among the red, green and blue light emitting portions 310, 320 and 330 is increased so that the current density of the green light emitting portion 320 is decreased, thereby increasing the lifetime for the green light emitting portion 320.

Embodiment 5

Figure 8:
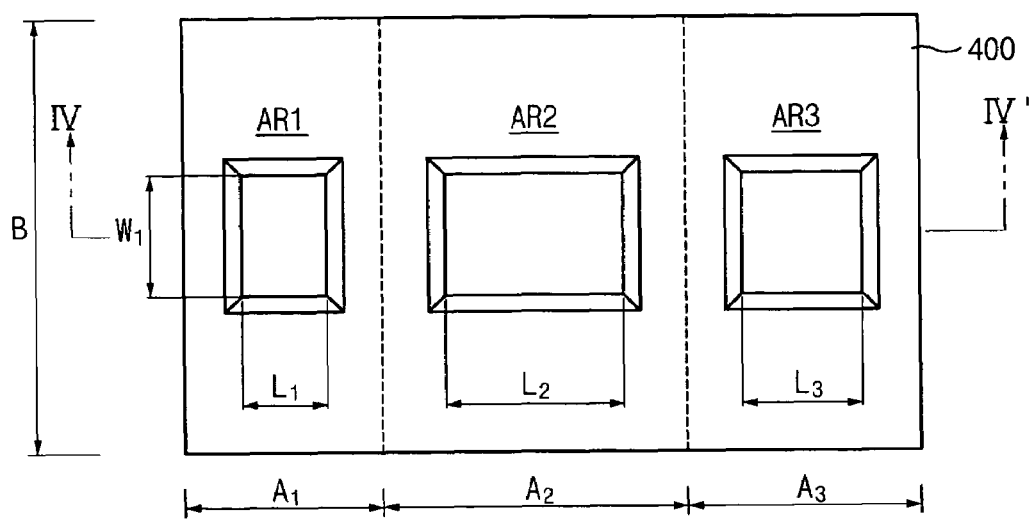
FIG. 8 is a plan view illustrating a display device in accordance with a fifth embodiment of the present invention.
Figure 9:
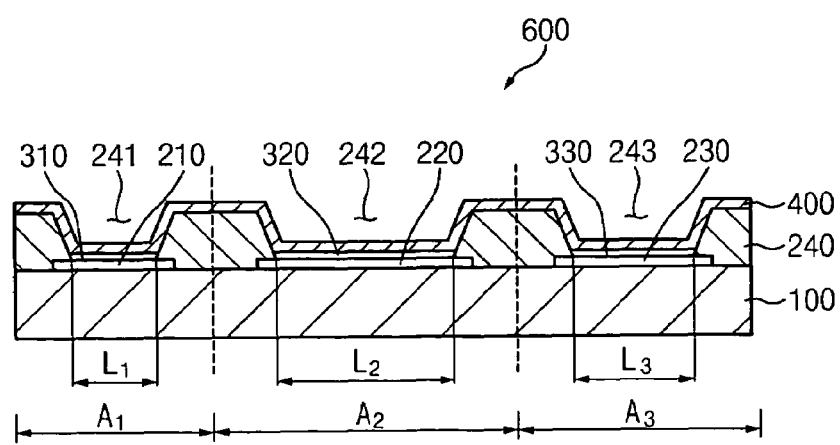
FIG. 9 is a cross-sectional view taken along a line IV-IV' in FIG. 8.

FIG. 8 is a plan view illustrating a display device in accordance with a fifth embodiment of the present invention. FIG. 9 is a cross-sectional view taken along a line IV-IV' in FIG. 8. The display device of the present embodiment is same as in Embodiment 2 except for first, second and third sub-pixel regions and red, green and blue light emitting portions. Thus, the same reference numerals will be used to refer to the same or like parts as those described in Embodiment 2 and any further explanation concerning the above elements will be omitted.

Referring to FIGS. 8 and 9, in order to increase the lifetime for the display device, a first area of a first sub-pixel region AR1, a second area of a second sub-pixel region AR2, and a third area of a third sub-pixel region AR3 330 are different from one another. The first sub-pixel region AR1 has a first length $A_1$ and a width B. The second sub-pixel region AR2 has a second length $A_2$ and the width B. The third sub-pixel region AR3 has a third length $A_3$ and the width B. Preferably, the first, second and third lengths $A_1$, $A_2$ and $A_3$ are different from one another. For example, the second length $A_2$ is larger than the third length $A_3$, and the third length $A_3$ is larger than the first length $A_1$.

In order to increase the lifetime for the display device, aperture ratios of the red, green and blue light emitting portions 310, 320 and 330 are different from one another. The aperture ratio of each of the red, green and blue light emitting portions 310, 320 and 330 is a ratio of the area of each of the first, second and third sub-pixel regions AR1, AR2 and AR3 to the area of each of the red, green and blue light emitting portions 310, 320 and 330. For example, the red light emitting portion 310 has a first width W. and a first interval $L_1$, the green light emitting portion 320 has a second width $W_2$ and a second interval $L_2$, the blue light emitting portion 330 has a third width $W_3$ and a third interval $L_3$. Preferably, the first, second and third widths $W_1$, $W_2$ and $W_3$ are different from one another.

Table 6 represents the initial luminances of the red, green and blue lights and the lifetimes of the red, green and blue light emitting portions 310, 320 and 330 of the embodiment of the present invention.

TABLE 6

|  | R | G | B |
|---|---|---|---|
| Luminance of the mixed light | | 100 cd/m² | |
| Loss | | 50% | |
| Relative area ratio | 0.84 | 1.12 | 1.04 |
| Aperture ratio | 29% | 46% | 42% |
| Initial luminance | 752 cd/m² | 567 cd/m² | 284 cd/m² |
| Lifetime | 10,965 hour | 10,897 hour | 10,878 hour |

Referring to Tables 2 and 6, the relative area ratio of the red light emitting portion 310 is reduced from 1 to 0.84 and the aperture ratio of the red light emitting portion 310 is reduced from 40% to 29% to increase a current density of the red light emitting portion 310. The relative area ratio is a ratio of each of the first, second and third sub-pixel regions AR1, AR2 and AR3 to one-third of the total area of the first, second and third sub-pixel regions AR1, AR2 and AR3. Thus, the initial luminance of the red light emitting portion 310 is increased from 451 cd/m² to 752 cd/m² so that the lifetime for the red light emitting portion 310 is reduced from 23,592 hours to 10,965 hours.

The relative area ratio of the green light emitting portion 320 is increased from 1 to 1.12, and the aperture ratio of the green light emitting portion 320 is increased from 40% to 46% to reduce a current density of the green light emitting portion 320. Thus, the initial luminance of the green light emitting portion 320 is reduced from 731 cd/m² to 567 cd/m² so that the lifetime for the green light emitting portion 320 is increased from 7,352 hours to 10,897 hours.

The relative area ratio of the blue light emitting portion 330 is increased from 1 to 1.04 and the aperture ratio of the blue light emitting portion 320 is reduced from 40% to 42% to reduce a current density of the blue light emitting portion 330. Thus, the initial luminance of the blue light emitting portion 330 is reduced from 312 cd/m² to 284 cd/m² so that the lifetime for the blue light emitting portion 330 is increased from 9,429 hours to 10,878 hours.

As it is described above, the red light emitting portion 310 having a longest lifetime among the red, green and blue light emitting portions 310, 320 and 330 is reduced so that the current density of the red light emitting portion 310 is increased. On the contrary, the green light emitting portion 320 having a shortest lifetime among the red, green and blue light emitting portions 310, 320 and 330 is increased so that the current density of the green light emitting portion 320 is increased, thereby increasing the lifetime for the green light emitting portion 320.

Embodiment 6

Figure 10:
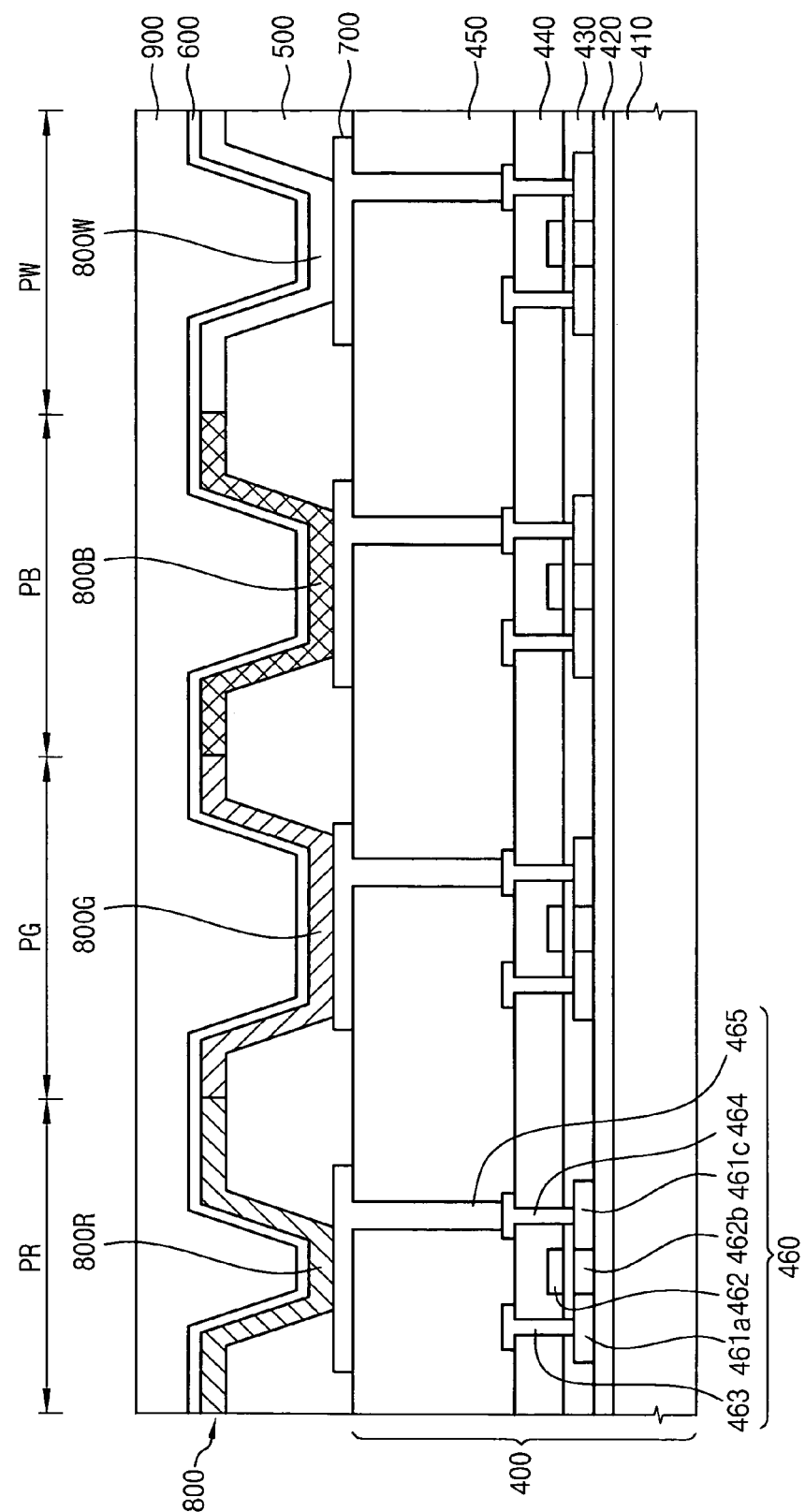
FIG. 10 is a cross-sectional view showing a display device according to a sixth embodiment of the present invention.

FIG. 10 is a cross-sectional view showing a display device according to a sixth embodiment of the present invention. The display device shown in FIG. 10 forms a full color image using an independent RGB layer structure. For example, the display device may be organic light emitting display device (OLED). The OLED is a bottom emission type OLED. A light for displaying an image is irradiated downwardly.

Referring to FIG. 10, the OLED includes a first electrode 600, and a plurality of second electrodes 700 to thereby form a plurality of sub-pixels having the first electrodes, and an organic light emitting layer 800 interposed between the first and second electrodes 600 and 700 corresponding to each of the sub-pixels, respectively. Therefore, each of the sub-pixels includes the first and second electrodes, and the organic light emitting layer interposed between the first and second electrodes. The organic light emitting layer 800 includes a red light emitting portion 800R for emitting a red light, a green light emitting portion 800G for emitting a green light, a blue light emitting portion 800B for emitting a blue light, and a white light emitting portion 800W for emitting a white light.

A support 400 is below the second electrode 700 to support the second electrode 700. The support 400 includes a plurality of switching elements 460 corresponding to the second electrodes 700, respectively, for selectively transferring electrical signals to the second electrode 700. In this embodiment, a thin film transistor (TFT) 460 is used as each of the switching elements. However, the present embodiment is not limited to the OLED, and allows for other configurations that would be known to one of the ordinary skill in the art. In this embodiment, the second electrode 800 of this embodiment functions as an anode, and the first electrode 600 functions as a cathode.

The support 400 includes a substrate 410, a plurality of insulating layers 420, 430, 440 and 450, and the TFTs 460 for transferring electrical signals to the second electrodes, respectively.

The substrate 410 comprises a transparent material so that the light generated from the bottom of the OLED passes through the substrate 410. The transparent substrate 410 may include glass, quartz, glass ceramic, or crystallized glass for enduring the manufacturing process at a high temperature. Alternatively, the substrate 410 may include a conductive material.

A substrate insulation layer 420 is coated on a whole surface of the substrate 410 for electrically insulating the substrate 410 from the TFTs 460. The substrate insulation layer 420 may be coated on the conductive substrate or a substrate including a plurality of moving ions. The quartz substrate may not include the substrate insulation layer 420. The substrate insulation layer 420 may include silicon oxide, silicon nitride, or silicon oxynitride.

A plurality of active patterns of the TFT is on an upper surface of the substrate insulation layer 420. Each of the active patterns corresponds to one of the second electrodes 200. Each of the active patterns includes a source portion 461a, a channel portion 461b, and a drain portion 461c. In this exemplary embodiment, the channel portion 461b includes polysilicon. Alternatively, the channel portion 461b may include amorphous silicon (a-Si), and the TFT may have a proper configuration different from the structure described in this embodiment. A gate insulation layer 430 is coated on the substrate 410 and the active patterns. A portion of the gate insulation layer 430, which is higher than the active patterns, is removed so that the gate insulation layer 430 planarizes an upper surface of the substrate 410 including a stepped portion formed by the active pattern. A gate electrode 462 that receives a selection signal is positioned on the gate insulation layer 430 corresponding to the channel portion 462b of the active patterns. A first insulating interlayer 440 is coated on the gate insulation layer 430 and the gate electrode 462. A portion of the first insulating interlayer 440, which is higher than the gate electrode 462, is removed so that the first insulating interlayer 440 planarizes an upper surface of the gate insulation layer 430 including a stepped portion formed by the gate electrode 462. A source electrode 463 and a drain electrode 464 are positioned on the planarized gate insulation layer 430 corresponding to the source portion 461a and drain portion 461c of the active patterns, respectively. A data signal is applied to the source electrode 463, and the drain electrode 464 selectively makes electrical contact with the source electrode 463 through a channel formed in each of the active patterns based on the voltage of the selection signal applied to the gate electrode 462. A portion of the gate insulation layer 430 covering the source and drain portions 461a and 461c is opened, and the source and drain electrodes 463 and 464 make electrical contact with the source and drain portions 461a and 461c, respectively. In this embodiment, the gate electrode 462 has a mono-layered structure. Alternatively, the gate electrode 462 may have a multi-layered structure such as a double-layered structure and a triple-layered structure.

A second insulating interlayer 450 is formed on the first insulating interlayer 440 and the source and drain electrodes 463 and 464. A portion of the second insulating interlayer 450, which is higher than the source and drain electrodes 463 and 464, is removed so that the second insulating interlayer 450 planarizes the upper surface of the first insulating interlayer 440 including a stepped portion formed by the source and gate electrodes 463 and 464. The second electrode 200 is positioned on the planarized second insulating interlayer 450. A portion of the second insulating interlayer 450 covering the drain electrode 464 is opened to thereby forming a contact hole. The contact hole is filled with a conductive oxidized material to form a pixel electrode 465. The second electrode 700 makes electrical contact with the drain electrode 464 through the pixel electrode 465. In this embodiment, the second electrode 700 is formed with the pixel electrode 465, and the second electrode 700 has substantially same material as the pixel electrode 465. The gate voltage applied to the gate electrode 462 controls a current passing through the second electrode 200.

A plurality of banks 500 is between second electrodes 700 adjacent to each other so that an emitting region of each of the sub-pixels is defined by the banks 500. The banks 500 are on peripheral portions of adjacent second electrodes 700. The organic light emitting layer 800 is coated on the second electrode 800 and the banks 500. In one embodiment, the organic light emitting layer 800 is formed using an inkjet printing method such that each of the sub-pixels emits a color light among red, green, blue and white lights. Accordingly, the organic light emitting layer 800 includes a red light emitting portion 800R for emitting a red light, a green light emitting portion 800G for emitting a green light, a blue light emitting portion 800B for emitting a blue light, and a white light emitting portion 800W for emitting a white light. The sub-pixel corresponding to the red light emitting portion 800R is referred to as a red sub-pixel PR. The sub-pixel corresponding to the green light emitting portion 800G is referred to as a green sub-pixel PG. The sub-pixel corresponding to the blue light emitting portion 800B is referred to as a blue sub-pixel PB. The sub-pixel corresponding to the white light emitting portion 800W is referred to as a white sub-pixel PW. Each of the light emitting portions 800R, 800G, 800B, and 800W may have a single layered structure or a multi-layered structure that has a plurality of organic thin layers. The organic thin layers are stacked for improving light efficiency. When a driving voltage is applied to the first and second electrodes 600 and 700, a plurality of electrons from the first electrodes 600 that are cathodes is combined with a plurality of holes from the second electrodes 700 that are anodes in the organic light emitting layer 800 to generate a light. In one embodiment, a positive charge carrier injection layer (not shown) may be formed between the second electrode 700 and the organic light emitting layer 800, and a negative charge carrier transportation layer (not shown) may be formed between the first electrode 600 and the organic light emitting layer 800.

The first electrode 600 is formed on the organic light emitting layer 800. The first electrode 600 functions as a cathode in the present embodiment. In one embodiment, the first electrode 600 includes a metal that has a low ionization tendency and a low work function so that the first electrode 600 easily emits electrons from the first electrode 600. For example, the first electrode 600 may include magnesium (Mg), lithium (Li), calcium (Ca), or a combination thereof. A protective layer 900 may be formed on the first electrode 600 so as to protect the first electrode 600 and the organic light emitting layer 800 from externally provided impurity such as moisture, oxygen, etc.

Figure 11A:
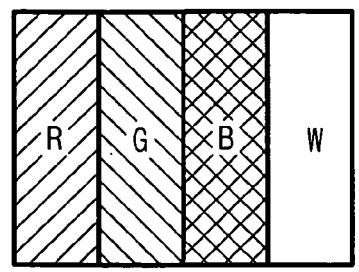
FIGS. 11A to 11C are plan views illustrating pixel arrangements for forming a color image.
Figure 11B:
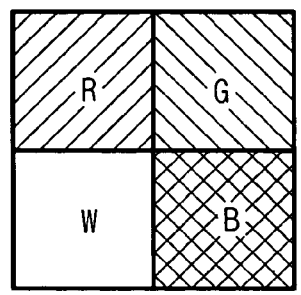
Figure 11C:
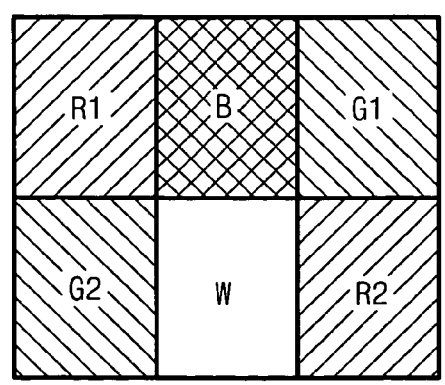

FIGS. 11A to 11C are plan views illustrating pixel arrangements for forming a color image.

Referring to FIG. 11A, red, green, blue and white sub-pixels PR, PG, PB, and PW are arranged in a first direction so that the red, green, blue and white sub-pixels PR, PG, PB, and PW have a linear shape or a stripe shape. Therefore, the OLED displays a full color image using a four-color system of the red, green, blue, and white sub-pixels PR, PG, PB, and PW. In this embodiment, the red, green, blue and white sub-pixels PR, PG, PB, and PW have same contact areas as one another. Alternatively, the red, green, blue and white sub-pixels PR, PG, PB, and PW may have different contact areas from one another.

Referring to FIG. 11B, a red sub-pixel PR and a green sub-pixel PG are alternately arranged in a first direction, and a red sub-pixel PR and a white sub-pixel PW are alternately arranged in a second direction that is substantially perpendicular to the first direction. In addition, the green sub-pixel PG and a blue sub-pixel PB are alternately arranged in the second direction. Therefore, the OLED includes the red, green, blue, and white sub-pixels PR, PG, PB, and PW that form a 2×2 lattice.

Referring to FIG. 11C, the OLED includes a first red sub-pixel PR1, a blue sub-pixel PB, a first green sub-pixel PG1, a second green sub-pixel PG2, a white sub-pixel PW and a second sub-pixel PR2. The first red sub-pixel PR1, the blue sub-pixel PB and the first green sub-pixel $PG_1$ are arranged in a first direction. The second green sub-pixel PG2, the white sub-pixel PW and the second sub-pixel PR2 are arranged in the first direction. The first red sub-pixel PR1 and the second green sub-pixel PG2 are alternately arranged in a second direction that is substantially perpendicular to the first direction. The blue sub-pixel PB and the white sub-pixel PW are alternately arranged in the second direction. The first green sub-pixel PG1 and the second red sub-pixel PR2 are alternately arranged in the second direction. Therefore, the pixel of the OLED includes the red, green, blue, and white sub-pixels PR, PG, PB, and PW forming a 2×3 lattice. In one embodiment, the first and second red sub-pixels PR1 and PR2 are arranged as being spaced apart from each other by a predetermined distance and are adjacent to the second and first green sub-pixels PG2 and PG1, respectively. Accordingly, the first and second green sub-pixels PG1 and PG2 are also arranged as being spaced apart from each other by a predetermined distance and adjacent to the second and first red sub-pixels PR2 and PR1, respectively. Alternatively, the first and second red sub-pixels PR1 and PR2 may be adjacent to each other. In addition, the first and second green sub-pixels PG1 and PG2 may also be arranged adjacent to each other.

In order to generate the lights for displaying an image, a luminance of the red light that is generated from the red light emitting portion 800R, a luminance of the green light that is generated from the green light emitting portion 800G, a luminance of the blue light that is generated from the blue light emitting portion 800B, and a luminance of the white light that is generated from the white light emitting portion 800W are different from one another. For example, the red, green, blue and white lights are mixed at a predetermined ratio to display the image. In this embodiment, the red, green and blue lights are mixed at the ratio of about 30% to 50% to 20%.

When an entire luminance of the red light, green light, and the blue light is 300 cd/m$^2$, the red light has a luminance of 90 cd/m$^2$, the green light has a luminance of 150 cd/m$^2$, and the blue light has a luminance of 60 cd/m$^2$. Thus, the red light having the luminance of 90 cd/m$^2$, the green light having the luminance of 150 cd/m$^2$, and the blue light having the luminance of 60 cd/m$^2$ form the mixed light having a luminance of 100 cd/m$^2$.

The red light emitting portion 800R, the green light emitting portion 800G, the blue light emitting portion 800B and the white light emitting portion 800W are manufactured by various organic light emitting materials so that lifetimes of the red, green, blue and white light emitting portions 800R, 800G, 800B and 800W are different from one another. Thus, a lifetime for the OLED having the light luminance layer 800 is determined by the light emitting portion that has shortest lifetime among the red, green, blue and white light emitting portions 800R, 800G, 800B and 800W.

Referring to FIGS. 10 and 11C, the red first light emitting portion 800R has a first area. The green light emitting portion 800G has a second area. The blue light emitting portion 800B has a third area. The white light emitting portion 800W has a fourth area. The first, second, third and fourth areas may be adjusted to one another so as to increase the lifetime for the display device. For example, the first, second, third and fourth areas are different from one another. In this exemplary embodiment, the white light emitting portion 800W has the longest lifetime among the red, green, blue and white light emitting portions 800R, 800G, 800B and 800W so that the first, second and third areas are only adjusted to one another so as to increase the lifetime for the display device.

Referring again to Table 2, when the aperture ratios of the red light emitting portion R, the green light emitting portion G and the blue light emitting portion B are substantially equal to one another, the lifetimes of the red, blue and the green light emitting portions R, B and G are successively reduced by the named order. For example, the lifetime for the red light emitting portion R is 23,592 hours. The lifetime for the blue light emitting portion B is 9,429 hours. The lifetime for the green light emitting portion G is 7,352 hours. Therefore, the lifetime for the OLED is 7,352 hours that is substantially the same as that of the green light emitting portion G.

In order to increase the lifetime for the display device, for example, the first area of the red light emitting portion 800R having a longest lifetime among the red, green and blue light emitting portions 800R, 800G and 800B is reduced. In addition, the second area of the green light emitting portion 800G having a shortest lifetime among the red, green and blue light emitting portions 800R, 800G and 800B is increased.

Table 7 represents the initial luminances of the red, green and blue lights and the lifetimes of the red, green and blue light emitting portions 800R, 800G and 800B of the present invention.

TABLE 7

|  | R | G | B |
|---|---|---|---|
| Luminance of the mixed light |  | 200 cd/m$^2$ |  |
| Loss |  | 50% |  |
| Area ratio |  | 33.3% |  |
| Aperture ratio | 23% | 50% | 42% |
| Object luminance | 785 cd/m$^2$ | 589 cd/m$^2$ | 297 cd/m$^2$ |
| Lifetime | 10,287 hour | 10,274 hour | 10,145 hour |

Referring to Tables 2 and 7, the aperture ratio of the red light emitting portion 800R is reduced from 40% to 23% to increase a current density of the red light emitting portion 800R. Thus, the object luminance of the red light emitting portion 800R is increased from 451 cd/m$^2$ to 785 cd/m$^2$ so that the lifetime for the red light emitting portion 800R is reduced from 23,592 hours to 10,287 hours.

The aperture ratio of the green light emitting portion 800G is increased from 40% to 50% so that a current density of the green light emitting portion 800G is decreased. Thus, the initial luminance of the green light emitting portion 800G is reduced from 731 cd/m$^2$ to 589 cd/m$^2$ so that the lifetime for the green light emitting layer 320 is increased from 7,352 hours to 10,274 hours.

The aperture ratio of the blue light emitting portion 800B is increased from 40% to 42% so that a current density of the blue light emitting portion 800B is decreased. Thus, the initial luminance of the blue light emitting portion 800B is reduced from 312 cd/m$^2$ to 297 cd/m$^2$ so that the lifetime for the blue light emitting portion 800B is increased from 9,429 hours to 10,145 hours.

As it is described above, the first area of the red light emitting portion 800R having a longest lifetime among the red, green and blue light emitting portions 800R, 800G and 800B is reduced so that the current density of the red light emitting portion 800G is increased. On the-contrary, the second area of the green light emitting portion 800G having a shortest lifetime among the red, green and blue light emitting portions 800R, 800G and 800B is increased for decreasing the current density of the green light emitting portion 800G so that the lifetime for the green light emitting portion 800G is increased.

Method of Manufacturing Display Device

Embodiment 7

Figure 12A:
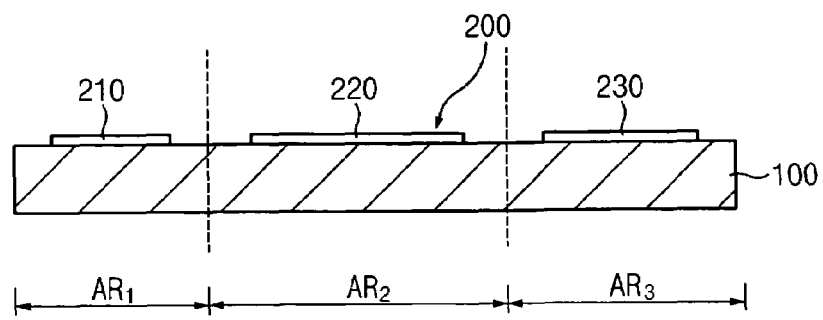
FIGS. 12A to 12C are cross-sectional views illustrating a method of manufacturing a display device in accordance with a seventh embodiment of the present invention.
Figure 12B:
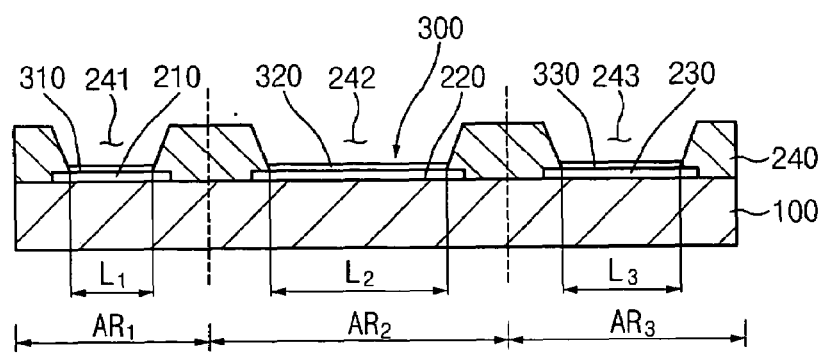
Figure 12C:
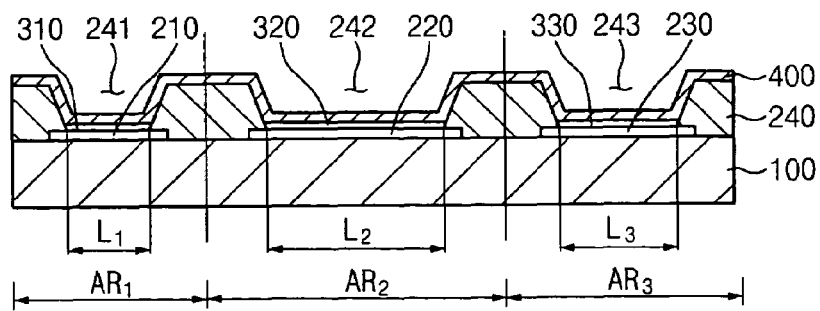

FIGS. 12A to 12C are cross sectional views illustrating a method of manufacturing a display device in accordance with a seventh embodiment of the present invention.

Referring to FIG. 12A, a base substrate 100, for example, such as a glass substrate has a plurality of sub-pixel regions. The sub-pixel regions include a first sub-pixel region AR1, a second sub-pixel region AR2 and a third sub-pixel region AR3.

The first, second and third sub-pixel regions AR1, AR2 and AR3 are arranged on the base substrate 100 in a matrix shape. When the display device has a resolution of about 1024×768, a number of the sub-pixel regions is about 1024×768×3 units.

A plurality of first electrodes 200 is formed on the first, second and third sub-pixel regions AR1, AR2 and AR3, respectively. In order to form the first electrodes 200, an indium tin oxide (ITO) film or an indium zinc oxide (IZO) is deposited on an entire of the base substrate 100 to form an ITO film or an IZO film. The ITO film or the IZO film is patterned to form the first electrodes 200 on the base substrate 100.

Referring to 12B, an organic film having an organic material or an inorganic film having an inorganic material is formed on the base substrate 100 having the first electrodes 200 to cover the first electrodes 200. In this embodiment of the present invention, the organic film has a photosensitive material that is reacted with a light.

The organic film is patterned to form a first recess portion 241, a second recess portion 242 and a third recess portion 243 in the organic film. The first, second and third recess portions 241, 242 and 243 correspond to the first electrodes 200 and the organic film. The first, second and third recess portions 241, 242 and 243 may have a lattice shape. In this embodiment, the organic film that has the lattice shape forms a bank 240.

The bank 240 covers a peripheral portion of the first electrodes 200. In order to increase the lifetime for the display device, a first volume of the first recess portion 241, a second volume of the second recess portion 242, and a third volume of the third recess portion 243 are different from one another.

The first, second and third volumes of the first, second and third recess portions 241, 242 and 243, respectively, are controlled by a width of the bank 240. When the width of the bank 240 increases, the first, second and third volumes are reduced. When the width of the bank 240 decreases, the first, second and third volumes are increased.

After the bank 240 having the first recess portion 241 is formed on the base substrate 100, a droplet having a red organic light emitting material is dropped into the first recess portion 241 to form a red organic light emitting film in the first recess portion 241.

A droplet having green organic light emitting material is dropped into the second recess portion 242 to form a green organic light emitting film in the second recess portion 242.

A droplet having blue organic light emitting material is dropped into the third recess portion 243 to form a blue organic light emitting film in the third recess portion 243.

The red light emitting film 310 formed in the first recess portion 241 generates a red light. The green light emitting film 320 formed in the second recess portion 242 generates a green light. The blue light emitting film 330 formed in the third recess portion 243 generates a blue light.

A first area of the red light emitting film 310, a second area of the green light emitting film 320 and a third area of the blue light emitting film 330 are different from one another. The first, second and third areas are determined by a width of the bank 240.

A second electrode 400 is formed on the base substrate 100 having the red, green and blue light emitting portions 310, 320 and 330 to cover the red, green and blue light emitting portions 310, 320 and 330, respectively. The second electrode 400 includes a metal, for example, such as aluminum or aluminum alloy.

Embodiment 8

Figure 13:
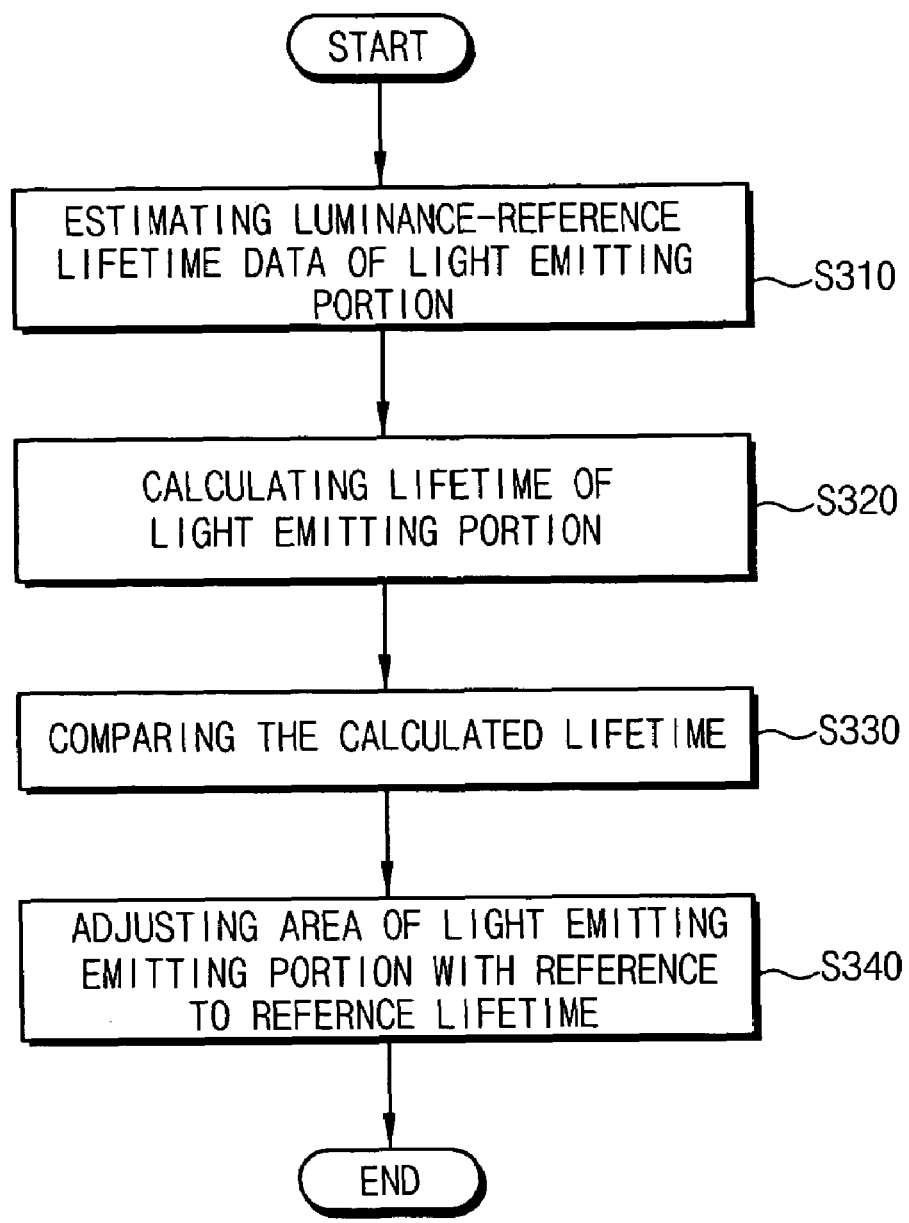
FIG. 13 is a flow chart illustrating a method of manufacturing a display device in accordance with an eighth embodiment of the present invention.

FIG. 13 is a flow chart illustrating a method of manufacturing a display device in accordance with an eighth embodiment of the present invention.

Referring to FIGS. 1, 2, 3 and 13, luminance-reference lifetime data of a red light emitting portion, a green light emitting portion and a blue light emitting portion are estimated (step 310). Unit current is applied to red, green and blue light emitting materials of substantially same areas so as to determine the reference lifetime. In this embodiment, the unit current is applied to the red, green and blue light emitting materials of various areas.

Primary areas of the red, green and blue light emitting portions are determined to generate a light by mixing red, green and blue lights generated from the red, green and blue light emitting portions, respectively. In addition, aperture ratios of sub-pixel regions on which the red, green and blue light emitting portions are formed may also be determined. A lifetime when a luminance of each of the red, green and blue light emitting portions having the primary areas decreases to a half of an initial luminance is calculated (step 320).

The calculated lifetimes of the red, green and blue light emitting portions are compared with each other (step 330). When the calculated lifetimes of the red, green and blue light emitting portions are different from one another, areas of the red, green and blue light emitting portions are adjusted with reference to the reference lifetimes so that the red, green and blue light emitting portions have uniform lifetimes (step 340).

Transparent conductive first electrodes 200 are formed on the base substrate 100 in a matrix shape, the red, green and blue light emitting portions are formed on the first electrodes 200 and a second electrode 400 is formed on the base substrate 100 to be electrically coupled with the red, green and blue light emitting portions.

Having described the exemplary embodiments of the present invention and its advantages, it is noted that various changes, substitutions and alterations can be made herein without departing from the spirit and scope of the invention as defined by appended claims.

What is claimed is:

1. A display device comprising:
a base substrate having a plurality of pixel regions;
a plurality of first electrodes formed on the pixel regions, respectively;
a light emitting layer on the first electrodes, the light emitting layer including first, second and third light emitting portions to generate a red light, a green light and a blue light, respectively, wherein the first light emitting portion has an area smaller than an area of the third light emitting portion which is smaller than an area of the second light emitting portion; and
a second electrode that is electrically coupled to the first, second and third light emitting portions.

2. The display device of claim 1, wherein areas of the pixel regions are substantially identical to each other.

3. The display device of claim 2, wherein a ratio of the areas of the first, second and third light emitting portions is about 0.23:0.5:0.42.

4. The display device of claim 2, wherein the first, second and third light emitting portions generate the red, green and blue lights having luminance of about 785 cd/m$^2$, about 589 cd/m$^2$ and about 297 cd/m$^2$, respectively.

5. The display device of claim 1, further comprising a bank formed between the first electrodes in a lattice shape.

6. The display device of claim 5, wherein the areas of the first, second and third light emitting portions are determined by a width of the bank between the areas.

7. A display device comprising:
a base substrate having first, second and third pixel regions;
a plurality of first electrodes formed on the first, second and third pixel regions, respectively;
a light emitting layer on the first electrodes, the light emitting layer including a first light emitting portion on the first pixel region, a second light emitting portion on the second pixel region, and a third light emitting portion on the third pixel region to generate a red light, a green light and a blue light respectively, a ratio of each of the areas of the first, second and third pixel regions to each of areas of the first, second and third light emitting portions being uniform, wherein the first pixel region has an area smaller than an area of the third pixel region which is smaller than an area of the second pixel region; and a second electrode that is electrically coupled to the first, second and third light emitting portions.

8. The display device of claim 7, wherein a ratio of the areas of the first, second and third pixel regions is about 0.6:1.3:1.1.

9. The display device of claim 7, wherein the first, second and third light emitting portions generate the red, green and blue lights having luminance of about 752 cd/m$^2$, about 567 cd/m$^2$ and about 284 cd/m$^2$, respectively.

10. The display device of claim 7, wherein the first, second and third light emitting portions have a substantially same lifetime.

11. The display device of claim 7, further comprising a bank formed between the first electrodes in a lattice shape.

12. The display device of claim 11, wherein the areas of the first, second and third light emitting portions are determined by a width of the bank between the areas.

13. A display device comprising:

a base substrate including a first pixel region that has a first area, a second pixel region that has a second area larger than the first area and a third pixel region that has a third area larger than the first area and smaller than the second area;

a plurality of first electrodes formed on the first, second and third pixel regions, respectively;

a light emitting layer on the first electrodes, the light emitting layer including first, second and third light emitting portions formed on the first, second and third pixel regions, respectively, the first, second and third light emitting portions having a fourth area, a fifth area larger than the fourth area and a sixth area larger than the fourth area and smaller than the fifth area and generating red light, a green light and a blue light, respectively; and a second electrode that is electrically coupled to the first, second and third light emitting portions.

14. The display device of claim 13, wherein ratios of the fourth area to the first area, the fifth area to the second area, and the sixth area to the third area are about 0.29, about 0.46 and about 0.42, respectively.

15. The display device of claim 13, further comprising a bank formed between the first electrodes in a lattice shape.

16. The display device of claim 15, wherein the areas of the first, second and third light emitting portions are determined by a width of the bank between the areas.

17. The display device of claim 13, wherein a ratio of the areas of the first, second and third pixel regions is about 0.84:1.12:1.04.

18. A display device comprising:

a base substrate having a first pixel region, a second pixel region, a third pixel region, and a fourth pixel region;

a plurality of first electrodes formed on the pixel regions, respectively;

a light emitting layer including a first light emitting portion formed on the first pixel region, a second light emitting portion formed on the second pixel region, a third light emitting portion formed on the third pixel region, and a fourth light emitting portion formed on the fourth pixel region, the first, second, third and fourth light emitting portions generating red, green, blue and white lights, respectively, wherein the first, second and third light emitting portions respectively have a first area, a second area larger than the first area, and a third area larger than the first area and smaller than the second area; and a second electrode that is electrically coupled to the light emitting layer.

19. The display device of claim 18, wherein areas of the pixel regions are substantially identical to each other.

20. The display device of claim 18, wherein the first, second, third and fourth light emitting portions have substantially same lifetimes as one another.

21. The display device of claim 18, further comprising a bank formed between the first electrodes in a lattice shape.

22. The display device of claim 21, wherein the areas of the first, second, third and fourth light emitting portions are determined by a width of the bank between the areas.

23. A method of manufacturing a display device comprising:

forming first electrodes in a plurality of pixel regions on a base substrate;

forming a red light emitting portion having a first area, a green light emitting portion having a second area larger than the first area and a blue light emitting portion having a third area larger than the first area and smaller than the second area on the first electrodes, respectively, wherein the red, green and blue light emitting portions generate a red light, a green light and a blue light, respectively; and forming a second electrode electrically coupled to the red, green and blue light emitting portions.

24. The method of claim 23, further comprising a bank formed between the first electrodes.

* * * * *